United States Patent
Ho et al.

(10) Patent No.: US 10,475,784 B2
(45) Date of Patent: Nov. 12, 2019

(54) SEMICONDUCTOR STRUCTURE WITH A RESISTOR AND A TRANSISTOR AND METHOD FOR FORMING THE SAME

(71) Applicant: Vanguard International Semiconductor Corporation, Hsinchu (TW)

(72) Inventors: Yu-Hao Ho, Keelung (TW); Shin-Cheng Lin, Tainan (TW); Wen-Hsin Lin, Jhubei (TW); Cheng-Tsung Wu, Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/608,374

(22) Filed: May 30, 2017

(65) Prior Publication Data
US 2018/0350799 A1 Dec. 6, 2018

(51) Int. Cl.
*H01L 27/06* (2006.01)
*H01L 29/78* (2006.01)
*H01L 29/66* (2006.01)
*H01L 29/06* (2006.01)

(52) U.S. Cl.
CPC ...... *H01L 27/0629* (2013.01); *H01L 29/0692* (2013.01); *H01L 29/66477* (2013.01); *H01L 29/78* (2013.01)

(58) Field of Classification Search
CPC ........... H01L 27/0629; H01L 29/66477; H01L 29/0692; H01L 29/78; H01L 28/20
See application file for complete search history.

(56) References Cited

U.S. PATENT DOCUMENTS

| | | | | |
|---|---|---|---|---|
| 2009/0085117 A1* | 4/2009 | Harada | ................ | H01L 27/0222 257/360 |
| 2012/0154026 A1* | 6/2012 | Karino | ................ | H01L 27/0629 327/543 |
| 2013/0032862 A1* | 2/2013 | Su | ....................... | H01L 27/0802 257/272 |
| 2013/0154705 A1* | 6/2013 | Sakurai | .................... | H03K 3/86 327/179 |
| 2015/0008539 A1* | 1/2015 | Kanda | ................... | H01L 29/402 257/409 |
| 2015/0137229 A1* | 5/2015 | Sulistyanto | ......... | H01L 29/7816 257/339 |

* cited by examiner

*Primary Examiner* — Steven H Loke
*Assistant Examiner* — Juanita B Rhodes
(74) *Attorney, Agent, or Firm* — Birch, Stewart, Kolasch & Birch, LLP

(57) ABSTRACT

A semiconductor structure is provided. A substrate has a first conductivity type. A first well and a second well are formed in the substrate. The first well has a second conductivity type. The second well has the first conductivity type. A doped region is formed in the first well and has the second conductivity type. A gate structure is disposed over the substrate and overlaps a portion of the first well and a portion of the second well. An insulating layer is disposed over the substrate and is spaced apart from the gate structure. A conducting wire is disposed on the insulating layer and includes a first input terminal and a first output terminal. The first input terminal is configured to receive an input voltage. The first output terminal is electrically connected to the doped region.

20 Claims, 9 Drawing Sheets

SEMICONDUCTOR STRUCTURE WITH A RESISTOR AND A TRANSISTOR AND METHOD FOR FORMING THE SAME

BACKGROUND OF THE INVENTION

Field of the Invention

The invention relates to a semiconductor structure, and more particularly to a semiconductor structure that provides a resistor and a transistor connected to the resistor in series.

Description of the Related Art

Integrated circuits typically include a large number of circuit elements, which form an electric circuit. Circuit elements provided in integrated circuits include active devices and passive devices. The active devices comprise transistors. In addition, the passive devices comprise resistors, capacitors, and inductors. In a conventional integrated circuit, metal lines are utilized to connect many independent elements. However, the size of the integrated circuit is increased. Additionally, an integrated circuit needs many conducting wires to connect elements. Therefore, the cost of the integrated circuit is increased.

BRIEF SUMMARY OF THE INVENTION

In accordance with an embodiment, a semiconductor structure comprises a substrate, a first well, a first doped region, a second well, a second doped region, a gate structure, a first insulating layer and a first conducting wire. The substrate has a first conductivity type. The first well is formed in the substrate and has a second conductivity type. The first doped region is formed in the first well and has the second conductivity type. The second well is formed in the substrate and has the first conductivity type. The second doped region is formed in the second well and has the second conductivity type. The gate structure is disposed over the substrate and overlaps a portion of the first well and a portion of the second well. The first insulating layer is disposed over the substrate and is spaced apart from the gate structure. The first conducting wire is disposed on the first insulating layer and comprises a first input terminal and a first output terminal. The first input terminal is configured to receive an input voltage. The first output terminal is electrically connected to the first doped region.

An exemplary embodiment of a method for manufacturing a semiconductor structure is described in the following. A substrate is provided. The substrate has a first conductivity type. A first well is formed in the substrate. The first well has a second conductivity type. A first doped region is formed in the first well. The first doped region has the second conductivity type. A second well is formed in the substrate. The second well has the first conductivity type. A second doped region is formed in the second well. The second doped region has the second conductivity type. A gate structure is formed on the substrate. The gate structure overlaps a portion of the first well and a portion of the second well. A first insulating layer is formed on the substrate. The first insulating layer is spaced apart from the gate structure. A first conducting wire is formed on the first insulating layer. The first conducting wire comprises a first input terminal configured to receive an input voltage and a first output terminal electrically connected to the first doped region.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
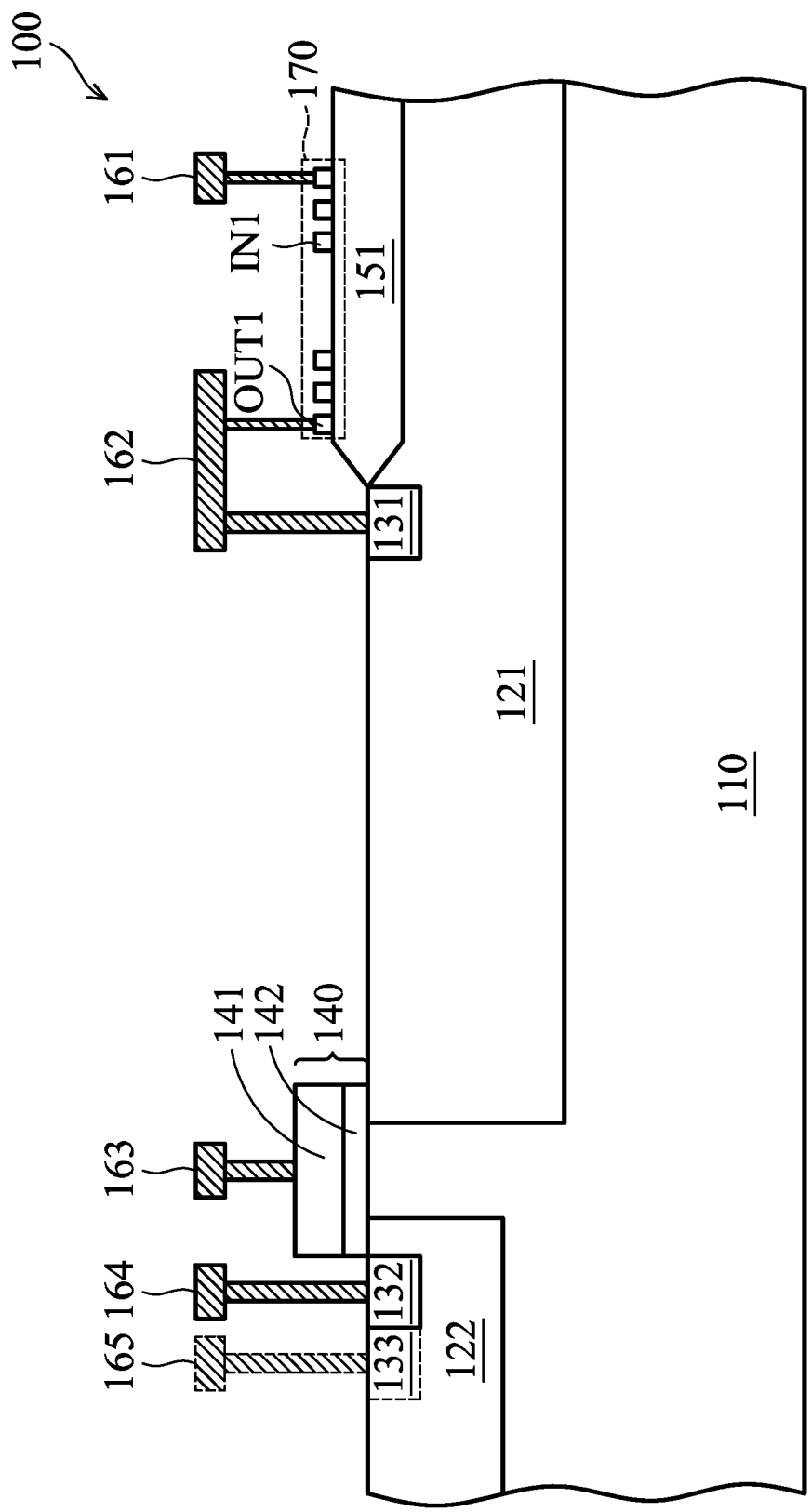
FIG. 1 is a schematic diagram of an exemplary embodiment of a semiconductor structure, according to various aspects of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

FIG. 1 is a schematic diagram of an exemplary embodiment of a semiconductor structure, according to various aspects of the present disclosure. The semiconductor structure 100 comprises a substrate 110, wells 121 and 122, doped regions 131 and 132, a gate structure 140, an insulating layer 150, and a conducting wire 170. The substrate 110 may include, but it not limited to, semiconductor substrate such as a silicon substrate. In other embodiment, the substrate 110 may be a lightly doped substrate such as a lightly doped P-type substrate or a lightly doped N-type substrate. In this embodiment, the substrate 110 has a first conductivity type.

The well 121 is formed in the substrate 110 and has a second conductivity type. In this embodiment, the first conductivity type is different from the second conductivity type. For example, the first conductivity type is P-type, and the second conductivity type is N-type. In another embodiment, the first conductivity type is N-type, and the second conductivity type is P-type. In other embodiment, the well 121 may be formed by ion implantation. For example, when the second conductivity type is N-type, the predetermined region for the well 121 may be implanted with phosphorous ions or arsenic ions to form the well 121. The doped region 131 is formed in the well 121 and has the second conductivity type. In this embodiment, the dopant concentration of the doped region 131 is higher than the dopant concentration of the well 121.

The well 122 is formed in the substrate 110 and has the first conductivity type. In this embodiment, the dopant concentration of the well 122 is higher than the dopant concentration of the substrate 110. In other embodiments, the well 122 may be formed by ion implantation. For example, when the first conductivity type is P-type, the predetermined region for the well 122 may be implanted with boron ions or indium ions to form the well 122.

The doped region 132 is formed in the well 122 and has the second conductivity type. In one embodiment, the dopant concentration of the doped region 132 is substantially equal to the dopant concentration of the doped region 131. In this embodiment, the well 122 further comprises a doped region 133. In one embodiment, the dopant concentration of the doped region 133 is higher than the dopant concentration of the well 122.

The gate structure 140 is disposed over the substrate 110 and overlaps a portion of the well 121 and a portion of the well 122. In this embodiment, the gate structure 140 is spaced apart from the doped region 131. As shown in FIG. 1, the gate structure 140 comprises a gate 141 and a gate dielectric layer 142. The gate 141 is formed on the gate dielectric layer 142. In one embodiment, a dielectric material layer (forming the gate dielectric layer 142) and a conductive material layer (forming the gate 141) thereon may be blanketly deposited over the substrate 110 sequentially. Subsequently, the gate dielectric layer 142 and the gate 141 are respectively formed from the dielectric material layer and the conductive material layer by patterning the above two layers through another photolithography and etch steps.

The material of the dielectric material layer (i.e. the material of the gate dielectric layer 142) may include, but is not limited to, silicon oxide, silicon nitride, silicon oxynitride, high-k material, any other suitable dielectric material, or a combination thereof. The high-k material may include, but is not limited to, metal oxide, metal nitride, metal silicide, transition metal oxide, transition metal nitride, transition metal silicide, transition metal oxynitride, metal aluminate, zirconium silicate, zirconium aluminate. For example, the material of the high-k material may include, but is not limited to, LaO, AlO, ZrO, TiO, $Ta_2O_5$, $Y_2O_3$, $SrTiO_3$(STO), $BaTiO_3$(BTO), BaZrO, $HfO_2$, $HfO_3$, HfZrO, HfLaO, HfSiO, HfSiON, LaSiO, AlSiO, HfTaO, HfTiO, HfTaTiO, HfAlON, $(Ba,Sr)TiO_3$(BST), $Al_2O_3$, any other suitable high-k dielectric material, or a combination thereof. The dielectric material layer may be formed by the previously described chemical vapor deposition or spin-on coating.

The material of the conductive material layer (i.e. the material of the gate 141) may include, but is not limited to, amorphous silicon, poly-silicon, one or more metal, metal nitride, conductive metal oxide, or a combination thereof. The metal may include, but is not limited to, molybdenum, tungsten, titanium, tantalum, platinum, or hafnium. The metal nitride may include, but is not limited to, molybdenum nitride, tungsten nitride, titanium nitride or tantalum nitride. The conductive metal oxide may include, but is not limited to, ruthenium oxide or indium tin oxide. The conductive material layer may be formed by the previous described chemical vapor deposition (CVD), sputtering, resistive thermal evaporation, electron beam evaporation, or any other suitable method. For example, in one embodiment, the amorphous silicon conductive material layer or poly-silicon conductive material layer may be deposited and formed by low-pressure chemical vapor deposition at about 525° C.~650° C. The thickness of the amorphous silicon conductive material layer or poly-silicon conductive material layer may range from about 1000 Å to 10000 Å.

The insulating layer 151 is disposed on the substrate 110 and spaced apart from the gate structure 140. In this embodiment, the insulating layer 151 directly contacts the doped region 131. As shown in FIG. 1, the insulating layer 151 is formed on the surface of the well 121 and extends into the well 121 from the surface of the well 121. In other embodiments, the insulating layer 151 may comprise a local-oxidation of silicon (LOCOS) or a shallow trench isolation (STI). The insulating layer 151 may has a round shape, a rectangular shape, a polygonal shape, or other shapes. In one embodiment, the insulating layer 151 is a field oxide layer.

Figure 2B:
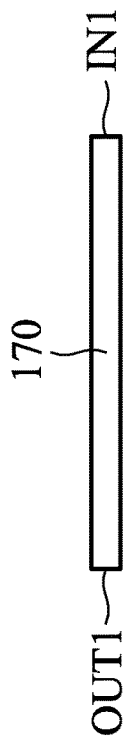
FIG. 2B is a top view of another exemplary embodiment of the conducting wire shown in FIG. 1.
Figure 2A:
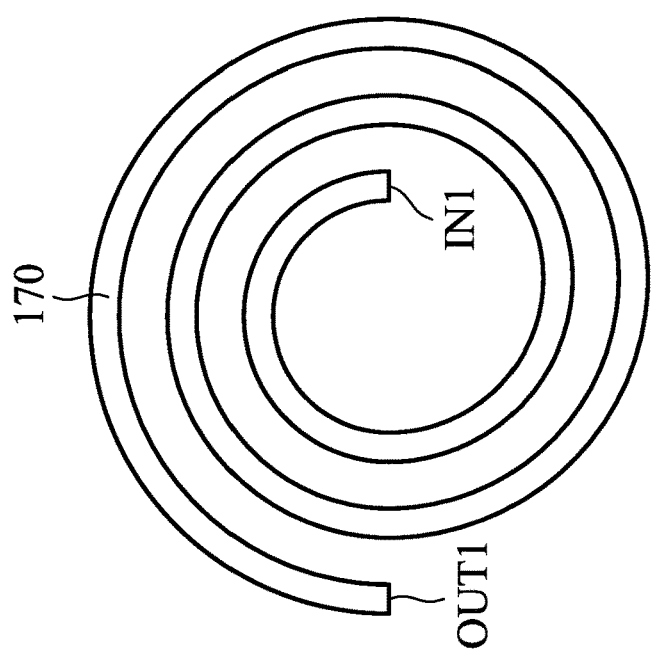
FIG. 2A is a top view of an exemplary embodiment of a conducting wire shown in FIG. 1.

The conducting wire 170 is disposed on the insulating layer 151 and comprises an input terminal IN1 and an output terminal OUT1. In this embodiment, the conducting wire 170 extends along a helical-shaped path or a strip-shaped path. The shape of the conducting wire 170 is shown in FIGS. 2A and 2B and described in the following. In the present invention, the material of the conducting wire 170 is not limited. The material of the conducting wire 170 may include metal, metal oxide, metal nitride, metal alloy, metal silicide, and other suitable conductive material, or a combination thereof. In one embodiment, the material of the conducting wire 170 is poly-silicon or SiCr. In this embodiment, the input terminal IN1 is configured to receive an input voltage. In one embodiment, the input voltage is higher than 250V. Additionally, the output terminal OUT1 is electrically connected to the doped region 131.

FIG. 2A is a top view of an exemplary embodiment of the conducting wire 170 shown in FIG. 1. As shown in FIG. 2A, the conducting wire 170 extends along a helical-shaped path. In this embodiment, the conducting wire 170 extends along a counterclockwise path from the input terminal IN1, but the disclosure is not limited thereto. In other embodiments, the conducting wire 170 may be extended along a clockwise path from the input terminal IN1. In FIG. 2B, the conducting wire 170 has a strip shape. The conducting wire 170 is extended along a strip-shaped path, but the disclosure is not limited thereto. The invention does not limit the extended path of the conducting wire 170. The conducting wire 170 may be extended along any path, as long as the conducting wire 170 does not crisscross itself.

Refer to FIG. 1, in this embodiment, the semiconductor structure 110 further comprises interconnection structures 161~164. The interconnection structure 161 is electrically to the input terminal IN1 to transmit an input voltage to the input terminal IN1. The interconnection structure 162 serves as a drain electrode. The interconnection structure 163 is electrically connected to the gate 141 to serve as a gate electrode. The interconnection structure 164 is electrically connected to the doped region 132 to serve as a source electrode. In this embodiment, the gate electrode, the drain electrode, and the source electrode compose a transistor. In other embodiments, the semiconductor structure 100 further comprises an interconnection structure 165. The interconnection structure 165 is electrically connected to the doped region 133. In one embodiment, the interconnection structure 165 serves as a bulk electrode of the transistor. In some embodiments, the interconnection structures 161~164 are formed in at least one insulating layer (not shown) formed on the substrate 110.

Figure 3:
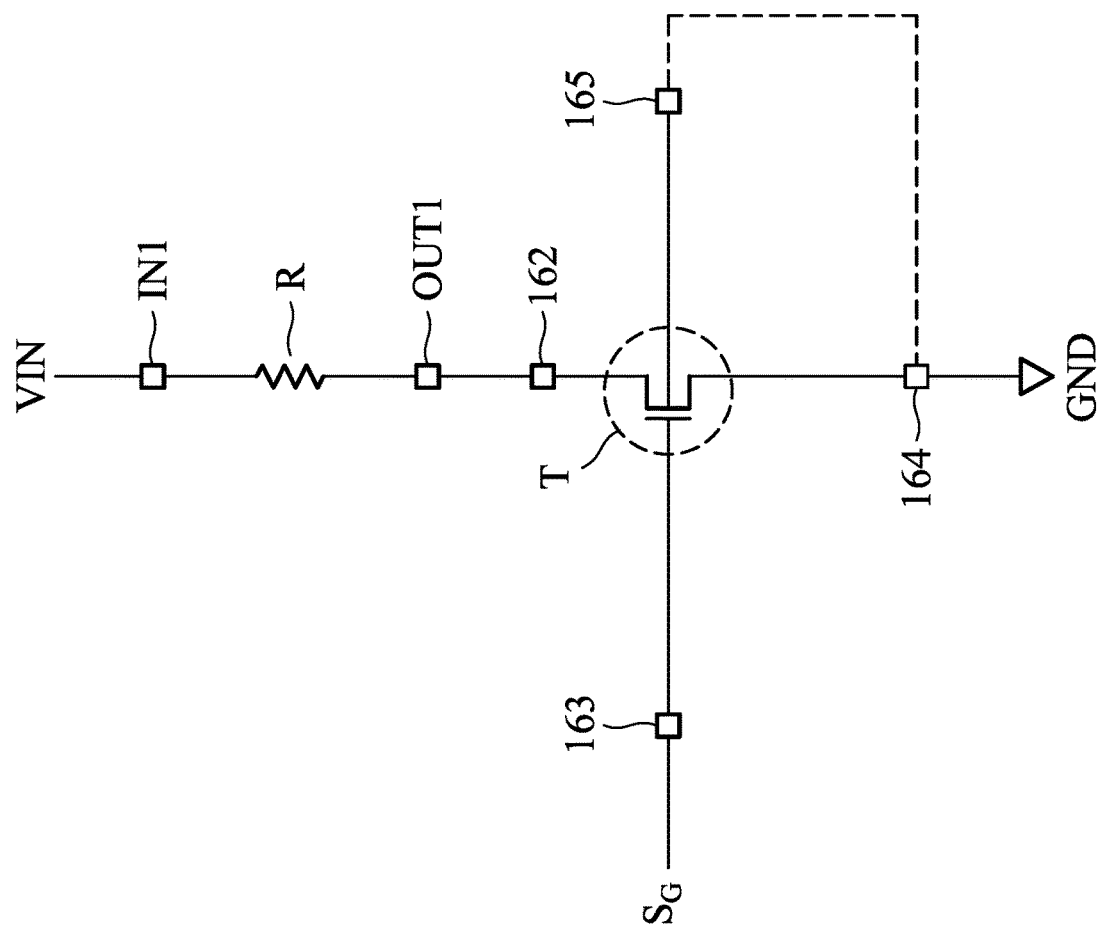
FIG. 3 is an equivalent circuit of an exemplary embodiment of the semiconductor structure according to an embodiment of the present invention.

FIG. 3 is an equivalent circuit of an exemplary embodiment of the semiconductor structure according to an embodiment of the present invention. The resistor R represents the equivalent impedance of the conducting wire 170. The transistor T represents the transistor comprising the gate 141, the doped regions 131 and 132. In one embodiment, the input terminal IN1 of the conducting wire 170 receives an input voltage VIN. In the present invention, the type of input voltage VIN is not limited. In one embodiment, the input voltage VIN is AC power or DC power. In other embodiments, the input voltage VIN is a high voltage, such as more than 250V.

The output terminal OUT1 of the conducting wire 170 is electrically connected to the drain of the transistor T through the interconnection structure 162. The source of the transistor T receives the ground voltage GND through the interconnection structure 164. The gate of the transistor T receives a gate signal $S_G$ through the interconnection structure 163. In one embodiment, the gate signal $S_G$ is utilized to turn on or off the transistor T. In some embodiments, the bulk of the transistor T receives the ground voltage GND through the interconnection structure 165.

Since the resistor R is connected to the transistor T in series, when the transistor T is turned off, no current passes through the resistor R. Therefore, no power consumption occurs in the resistor R. Additionally, when the resistor R is connected to the transistor T in series, the current passing through the transistor T can be measured. Furthermore, since the resistor R and the transistor T are formed in the same substrate, the size of the circuit can be reduced. In the present application, the impedance of the resistor R is not limited. When the length of the conducting wire 170 becomes long, the impedance of the resistor R is increased to decrease the input voltage VIN. For example, when the input voltage VIN is 500V, the voltage of the output terminal OUT1 may be 480V.

Figure 4:
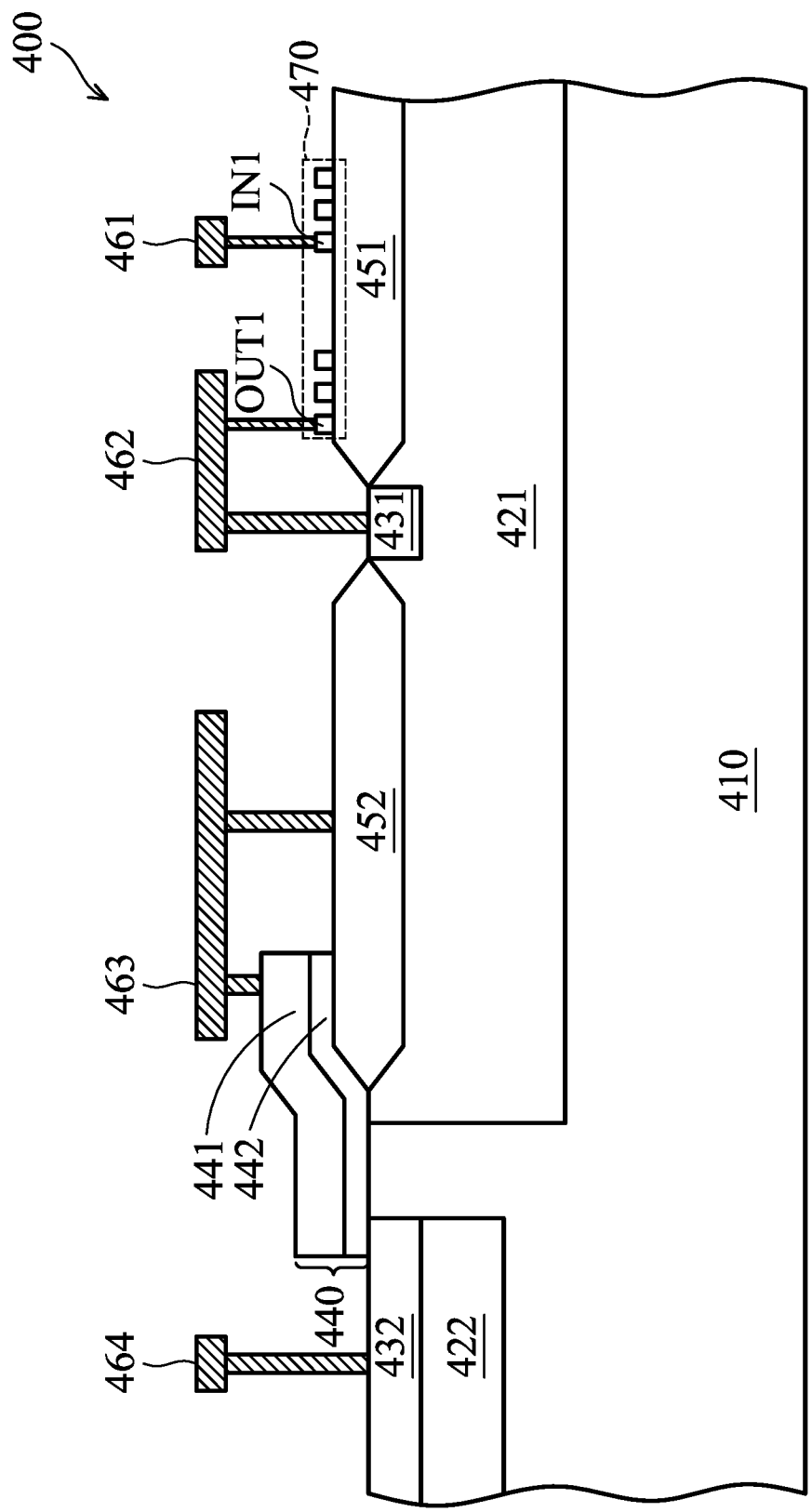
FIG. 4 is a schematic diagram of another exemplary embodiment of the semiconductor structure, according to various aspects of the present disclosure.

FIG. 4 is a schematic diagram of another exemplary embodiment of the semiconductor structure, according to various aspects of the present disclosure. The semiconductor structure 400 comprises a substrate 410, wells 421 and 422, doped regions 431 and 432, a gate structure 440, insulating layers 451 and 452, interconnection structures 461~464, and a conducting wire 470. Since the features of the substrate 410 are the same as the features of the substrate 110 shown in FIG. 1, the description of the substrate 410 is omitted.

The well 421 is similar to the well 121 of FIG. 1 with the exception that the well 421 further comprises an insulating layer 452. As shown in FIG. 4, the insulating layer 452 is formed on the surface of the well 421 and extends from the surface of the well 421 into a portion of the well 421. In this embodiment, the insulating layer 452 is formed between the well 422 and the insulating layer 451 and isolated from the insulating layer 451. Since the features of the insulating layers 451 and 452 are the same as the insulating layer 151 shown in FIG. 1, the descriptions of the insulating layers 451 and 452 are omitted. In this embodiment, the doped region 431 is formed between the insulating layers 451 and 452 and directly contacts the insulating layers 451 and 452, but the disclosure is not limited. In other embodiments, the doped region 431 does not directly contact at least one of the insulating layers 451 and 452. Since the features of the doped region 431 are the same as those of the doped region 131 shown in FIG. 1, the description of the doped region 431 is omitted.

The doped region 432 is formed in the well 422 and has the second conductivity type. The features of the well 422 are the same as the features of the well 122 shown in FIG. 1. The features of the doped region 432 are the same as the features of the doped region 132 shown in FIG. 1. Therefore, the descriptions of the well 422 and the doped region 432 are omitted. In another embodiment, the well 422 further comprises a doped region similar to the doped region 133 shown in FIG. 1, wherein the doped region has the first conductivity type.

The conducting wire 470 is disposed on the insulating layer 451 and comprises an input terminal IN1 and an output terminal OUT1. In this embodiment, the conducting wire 470 extends along a helical-shaped path on the insulating layer 451, but the disclosure is not limited. In other embodiments, the conducting wire 470 extends along a strip-shaped path or other paths on the insulating layer 451. Since the features of the conducting wire 470 are the same as the features of the conducting wire 170 shown in FIG. 1, the description of the conducting wire 470 is omitted.

The interconnection structure 461 is electrically connected to the input terminal IN1 of the conducting wire 470 to transmit an input voltage to the input terminal IN1. The interconnection structure 462 is electrically connected to the doped region 431 to serve as a drain electrode. In this embodiment, the interconnection structure 462 is further electrically connected to the output terminal OUT1 of the conducting wire 470. The interconnection structure 463 is electrically connected to the gate structure 440 to serve as a gate electrode. In this embodiment, the interconnection structure 463 is further electrically connected to the insulating layer 452, but the disclosure is not limited thereto. The interconnection structure 464 is electrically connected to the doped region 432 to serve as a source electrode. In this embodiment, the doped region 432, the gate structure 440, and the doped region 431 compose a transistor.

Figure 5:
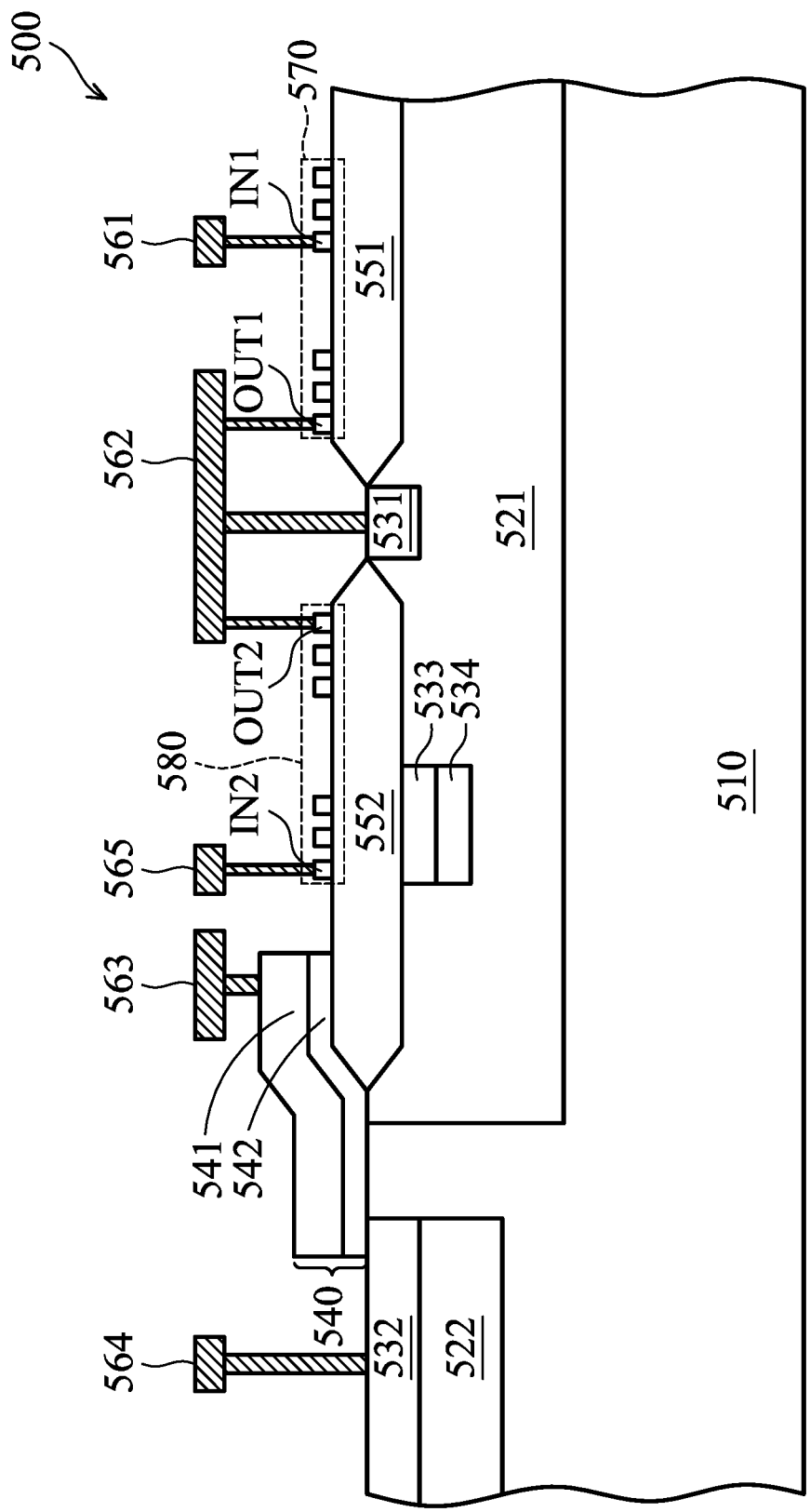
FIG. 5 is a schematic diagram of another exemplary embodiment of the semiconductor structure, according to various aspects of the present disclosure.

FIG. 5 is a schematic diagram of another exemplary embodiment of the semiconductor structure, according to various aspects of the present disclosure. FIG. 5 is similar to FIG. 4 except for the additions of the doped regions 533 and 534 and the conducting wire 580. Furthermore, the interconnection structure 563 shown in FIG. 5 is not electrically connected to the insulating layer 552. The operation of the substrate 510 is the same as the operation of the substrate 410 shown in FIG. 4. The operation of the well 521 is the same as the operation of the well 421 shown in FIG. 4. The operation of the well 522 is the same as the operation of the well 422 shown in FIG. 4. The operation of the doped region 531 is the same as the operation of the doped region 431 shown in FIG. 4. The operation of the doped region 532 is the same as the operation of the doped region 432 shown in FIG. 4. The operation of the gate structure 540 is the same as the operation of the gate structure 440 shown in FIG. 4. The operation of the insulating layer 551 is the same as the operation of the insulating layer 451 shown in FIG. 4. The operation of the insulating layer 552 is the same as the operation of the insulating layer 452 shown in FIG. 4. The operation of the interconnection structure 561 is the same as the operation of the interconnection structure 461 shown in FIG. 4. The operation of the interconnection structure 562 is the same as the operation of the interconnection structure 462 shown in FIG. 4. The operation of the interconnection structure 563 is the same as the operation of the interconnection structure 463 shown in FIG. 4. The operation of the interconnection structure 564 is the same as the operation of the interconnection structure 464 shown in FIG. 4. The operation of the conducting wire 570 is the same as the operation of the conducting wire 470 shown in FIG. 4. Therefore, the descriptions of the substrate 510, the wells 521 and 522, the doped regions 531 and 532, the gate structure 540, the insulating layers 551 and 552, the interconnection structures 561~564, and the conducting wire 570 are omitted.

As shown in FIG. 5, the doped region 533 is formed under the insulating layer 552 and has the second conductivity type. In one embodiment, the dopant concentration of the doped region 533 is higher than the dopant concentration of the well 521. Furthermore, the doped region 534 is formed under the doped region 533 and has the first conductivity type. In one embodiment, the dopant concentration of the doped region 534 is higher than the dopant concentration of the substrate 510. In this embodiment, the doped regions 533 and 534 compose a reduced surface field (RESURF) structure to reduce the surface field of the insulating layer 552.

In this embodiment, the conducting wire 580 is disposed on the insulating layer 552 and comprises an input terminal IN2 and an output terminal OUT2. In this embodiment, the conducting wire 580 extends along a strip-shaped path or other path. In the present invention, the extended path of the conducting wire 580 is not limited. In one embodiment, the conducting wire 580 extends along a helical-shaped path or a strip-shaped path. In other embodiments, the shape of the extended path of the conducting wire 580 may be the same or different from that of the conducting wire 570. In some embodiments, the conducting wire 580 may be connected to the conducting wire 570 in series or in parallel. Since the features of the conducting wire 580 are the same as the features of the conducting wire 170 shown in FIG. 1, the description of the conducting wire 580 is omitted. In one embodiment, the input terminal IN2 of the conducting wire 580 is electrically connected to the input terminal IN1 of the conducting wire 570, and the output terminal OUT2 of the conducting wire 580 is electrically connected to the output terminal OUT1 of the conducting wire 570, but the disclosure is not limited thereto. In other embodiments, the input terminal IN2 of the conducting wire 580 may be electrically connected to the interconnection structure 563 or 564.

Figure 6A:
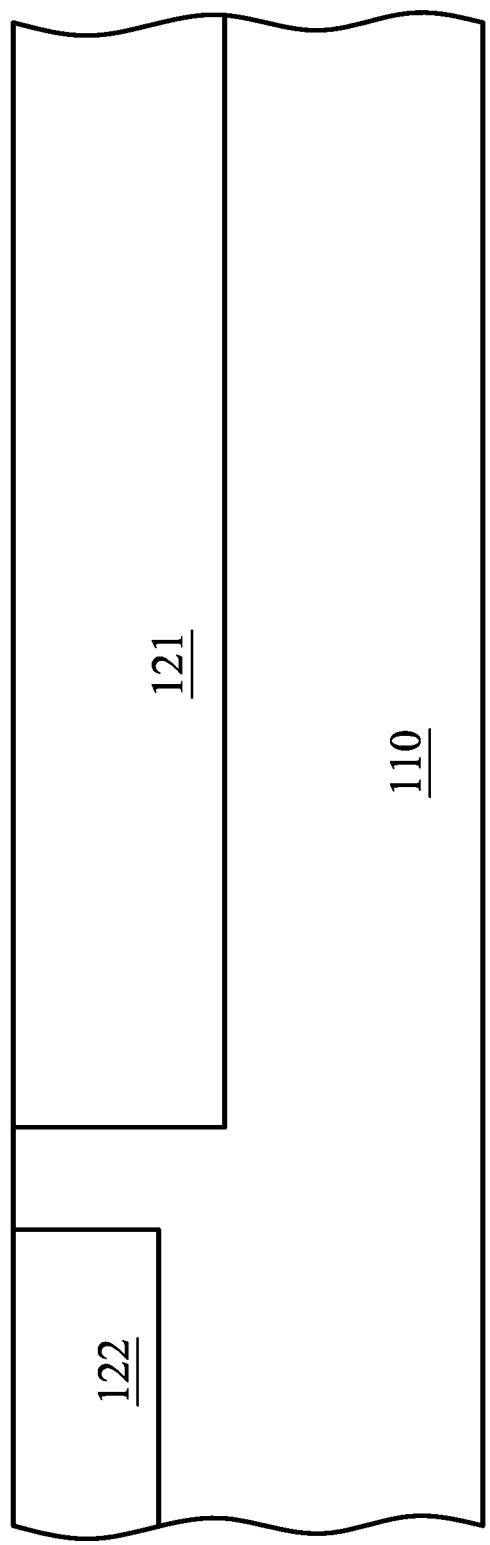
FIGS. 6A-6D are cross-sectional views of the semiconductor structure at various manufacturing stages in accordance with some embodiments of the present disclosure.

FIGS. 6A-6D are cross-sectional views of the semiconductor structure at various manufacturing stages in accordance with some embodiments of the present disclosure. Referring to FIG. 6A, a substrate 110, such as a silicon substrate, a silicon on insulator (SOI) substrate or another suitable semiconductor substrate, of a first conductivity type is provided.

Next, wells 121 and 122 are formed in the predetermined regions of the substrate 110 sequentially by a doping process (e.g., ion implantation), and a thermal diffusion process. In this embodiment, the conductivity type of the well 121 is different from the conductivity type of the well 122. For example, the well 121 has a second conductivity type, and the well 122 has the first conductivity type, wherein the dopant concentration of the well 122 is higher than the dopant concentration of the substrate 110. In one embodiment, the first conductivity type is P-type, and the second conductivity type is N-type. In other embodiments, the first conductivity type is N-type, and the second conductivity type is P-type.

Figure 6B:
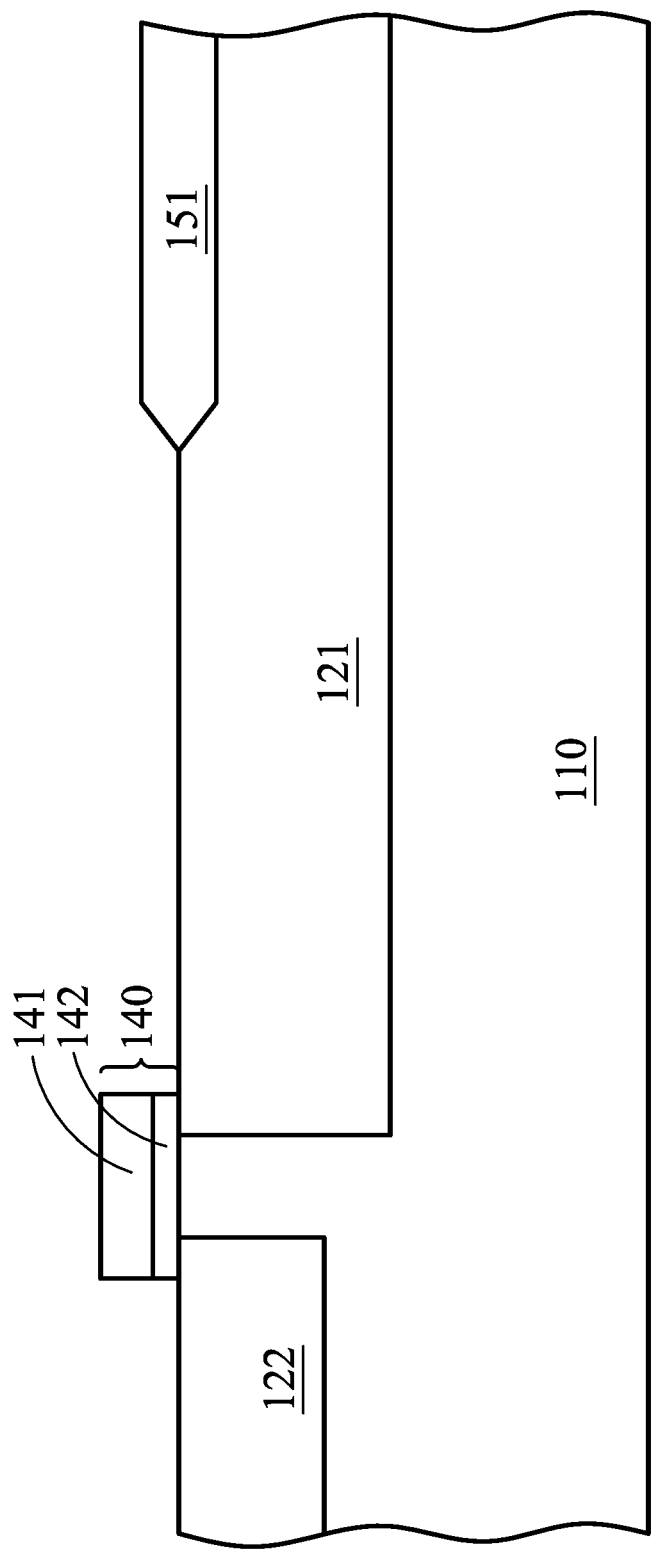

Referring to FIG. 6B, one or more insulating structures (e.g. the insulating layer 151) and a gate structure 140 are formed on the substrate 110. As shown in FIG. 6B, the insulating layer 151 is spaced apart from the gate structure 140.

Figure 6C:
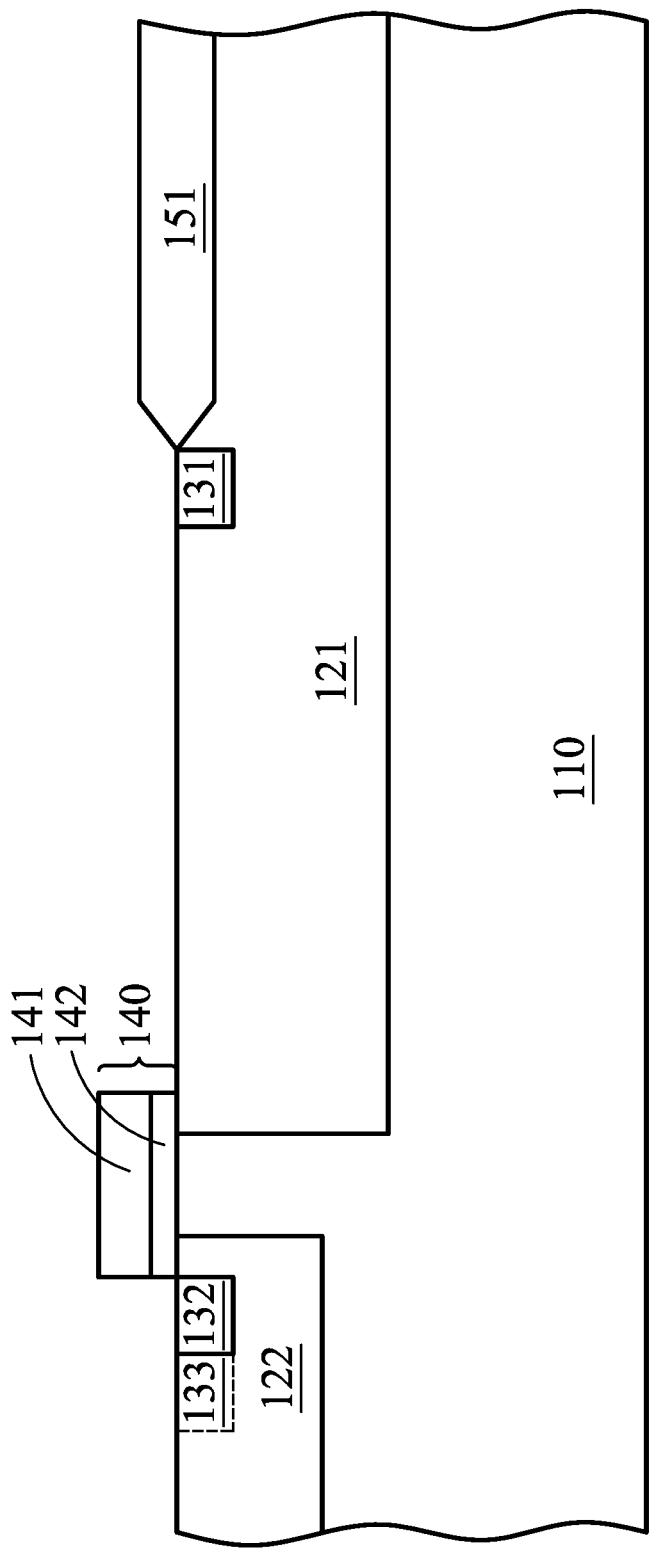

Referring to FIG. 6C, a doped region 131 having the second conductivity type is formed in the well 121 by a doping process (e.g., ion implantation) and a thermal diffusion process. In this embodiment, the doped region 131 directly contacts to the insulating layer 151, but the disclosure is not limited thereto. In other embodiment, the doped region 131 is spaced apart from the insulating layer 151. Additionally, a doped region 132 having the second conductivity type is formed in the well 121. In this embodiment, the dopant concentration of each of the doped regions 131 and 132 is higher than the dopant concentration of the well 121. In some embodiments, a doped region 133 having the first conductivity type is formed in the well 122. The dopant concentration of the doped region 133 is higher than the dopant concentration of the well 122.

Figure 6D:
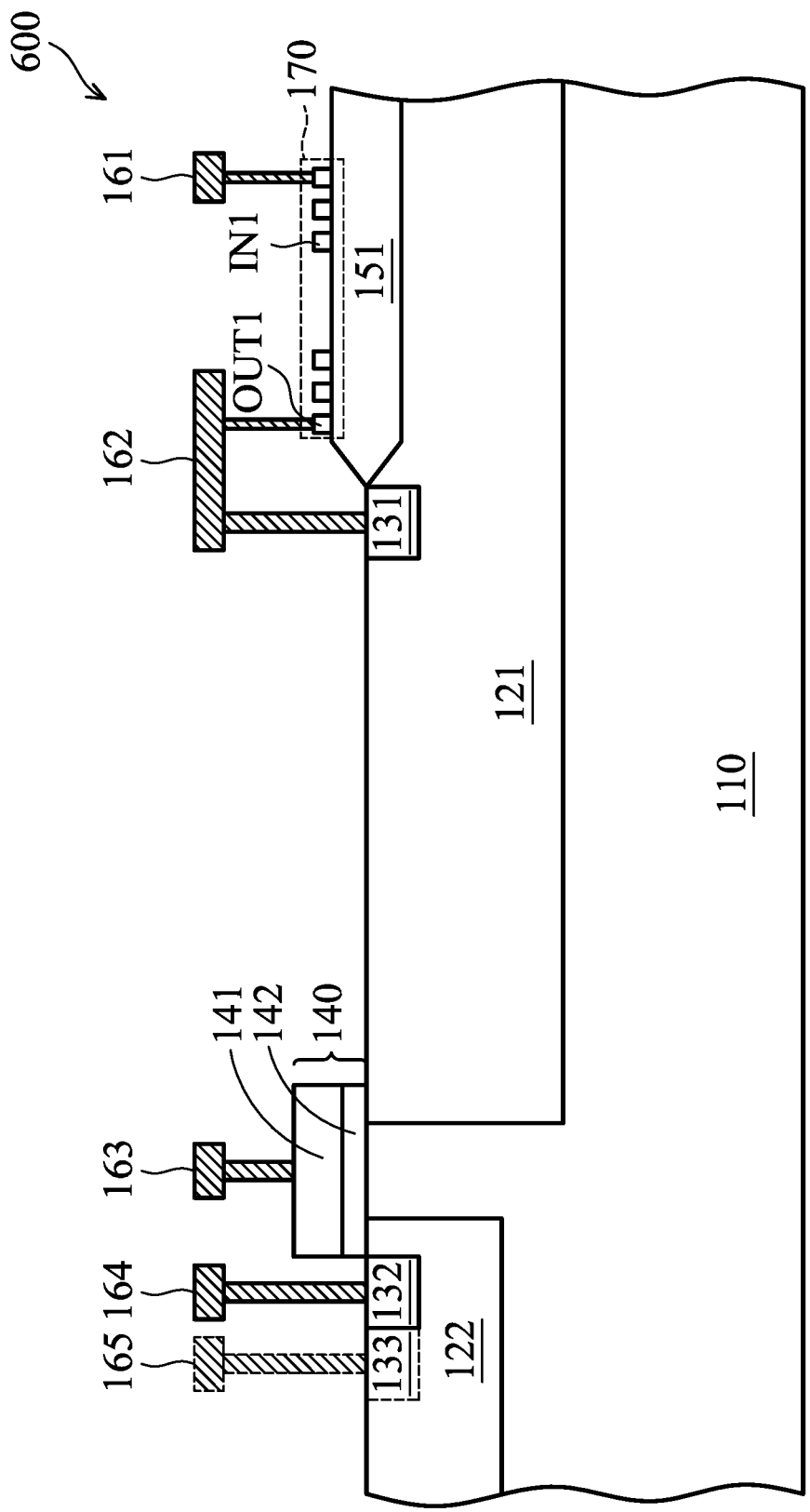

Referring to FIG. 6D, a conducting wire 170 is formed on the insulating layer 151 by a conventional metallization process, wherein the conducting wire 170 is extended along a specific-shaped path such that the conducting wire 170 has a specific shape. In the present invention, the shape of the extended path of the conducting wire 170 is not limited. In one embodiment, the conducting wire 170 is extended along a strip-shaped path or a helical-shaped path.

Next, interconnection structures 161~165 are formed on the substrate 110 by a conventional metallization process. The interconnection structure 161 is electrically connected to the input terminal IN1 to transmit an input voltage to the input terminal IN1. The interconnection structure 162 is electrically connected to the doped region 131 to serve as a drain electrode. In this embodiment, the interconnection structure 162 is further electrically connected to the output terminal OUT1. The interconnection structure 163 is electrically connected to the gate structure 140 to serve as a gate electrode. The interconnection structure 164 is electrically connected to the doped region 132 to serve as a source electrode. The interconnection structure 165 is electrically connected to the doped region 133 to serve as a bulk electrode. As a result, the fabrication of the semiconductor structure 100 is completed.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A semiconductor structure, comprising:
a substrate having a first conductivity type;
a first well formed in the substrate and having a second conductivity type;
a first doped region formed in the first well and having the second conductivity type;
a second well formed in the substrate and having the first conductivity type;
a second doped region formed in the second well and having the second conductivity type;

a gate structure disposed over the substrate and overlapping a portion of the first well and a portion of the second well;

a first insulating layer disposed over the substrate and spaced apart from the gate structure; and a first conducting wire disposed directly on the first insulating layer and comprising a first input terminal formed directly on the first insulating layer and a first output terminal formed directly on the first insulating layer wherein the first input terminal is configured to receive an input voltage, and the first output terminal is electrically connected to the first doped region, wherein the first input terminal is a first end of the first conducting wire and the first output terminal is a second end of the first conducting wire, wherein the first doped region is disposed between the gate structure and the first insulating layer, and wherein an entirety of the first conducting wire is directly above the first well.

2. The semiconductor structure as claimed in claim 1, wherein the first conductivity type is P-type, and the second conductivity type is N-type.

3. The semiconductor structure as claimed in claim 1, wherein the first conductivity type is N-type, and the second conductivity type is P-type.

4. The semiconductor structure as claimed in claim 1, wherein the first conducting wire has a helical shape or a strip shape.

5. The semiconductor structure as claimed in claim 1, further comprising:

a second insulating layer disposed between the second well and the first insulating layer and overlapping a portion of the gate structure, wherein the first insulating layer is spaced apart from the second insulating layer.

6. The semiconductor structure as claimed in claim 5, further comprising:

a third doped region formed under the second insulating layer and having the second conductivity type; and a fourth doped region formed under the third doped region and having the first conductivity type.

7. The semiconductor structure as claimed in claim 5, further comprising:

a second conducting wire disposed on the second insulating layer and comprising a second input terminal and a second output terminal, wherein the second input terminal is electrically connected to the first input terminal, and the second output terminal is electrically to the first output terminal.

8. The semiconductor structure as claimed in claim 1, wherein the input voltage is higher than 250V.

9. The semiconductor structure as claimed in claim 1, wherein the first insulating layer is a field oxide layer.

10. The semiconductor structure as claimed in claim 1, wherein the material of the first conducting wire is poly-silicon or SiCr.

11. A method for manufacturing a semiconductor structure, comprising:

providing a substrate having a first conductivity type;

forming a first well in the substrate, wherein the first well has a second conductivity type;

forming a first doped region in the first well, wherein the first doped region has the second conductivity type;

forming a second well in the substrate, wherein the second well has the first conductivity type;

forming a second doped region in the second well, wherein the second doped region has the second conductivity type;

forming a gate structure on the substrate, wherein the gate structure overlaps a portion of the first well and a portion of the second well;

forming a first insulating layer on the substrate, wherein the first insulating layer is spaced apart from the gate structure; and forming a first conducting wire directly on the first insulating layer, wherein the first conducting wire comprises a first input terminal formed directly on the first insulating layer and configured to receive an input voltage and a first output terminal formed directly on the first insulating layer and electrically connected to the first doped region, wherein the first input terminal is a first end of the first conducting wire and the first output terminal is a second end of the first conducting wire, wherein the first doped region is disposed between the gate structure and the first insulating layer, and wherein an entirety of the first conducting wire is directly above the first well.

12. The method as claimed in claim 11, wherein the first conductivity type is P-type, and the second conductivity type is N-type.

13. The method as claimed in claim 11, wherein the first conductivity type is N-type, and the second conductivity type is P-type.

14. The method as claimed in claim 11, wherein the first conducting wire has a helical shape or a strip shape.

15. The method as claimed in claim 11, further comprising:

forming a second insulating layer between the second well and the first insulating layer, wherein the second insulating layer overlaps a portion of the gate structure, and the first insulating layer is spaced apart from the second insulating layer.

16. The method as claimed in claim 15, further comprising:

forming a third doped region under the second insulating layer, wherein the third doped region has the second conductivity type; and forming a fourth doped region under the third doped region, wherein the fourth doped region has the first conductivity type.

17. The method as claimed in claim 15, further comprising:

forming a second conducting wire on the second insulating layer, wherein the second conducting wire comprises a second input terminal and a second output terminal;

electrically connecting the second input terminal to the first doped region; and electrically connecting the second output terminal to the gate structure.

18. The method as claimed in claim 11, wherein the input voltage is higher than 250V.

19. The method as claimed in claim 11, wherein the first insulating layer is a field oxide layer.

20. The method as claimed in claim 11, wherein the material of the first conducting wire is poly-silicon or SiCr.

* * * * *